US009536805B2

(12) United States Patent
Fazelpour et al.

(10) Patent No.: US 9,536,805 B2
(45) Date of Patent: Jan. 3, 2017

(54) POWER MANAGEMENT INTEGRATED CIRCUIT (PMIC) INTEGRATION INTO A PROCESSOR PACKAGE

(71) Applicant: QUALCOMM Incorporated, San Diego, CA (US)

(72) Inventors: Siamak Fazelpour, San Diego, CA (US); Jiantao Zheng, San Diego, CA (US); Mario Francisco Velez, San Diego, CA (US); Sun Yun, San Diego, CA (US); Rajneesh Kumar, San Diego, CA (US); Houssam Wafic Jomaa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/324,072

(22) Filed: Jul. 3, 2014

(65) Prior Publication Data
US 2016/0005715 A1    Jan. 7, 2016

(51) Int. Cl.
*H01L 23/00* (2006.01)
*H01L 25/00* (2006.01)
(Continued)

(52) U.S. Cl.
CPC ............ *H01L 23/42* (2013.01); *H01L 23/36* (2013.01); *H01L 23/49811* (2013.01);
(Continued)

(58) Field of Classification Search
CPC ...... H01L 23/16; H01L 23/31; H01L 23/4334; H01L 25/11; H01L 25/105; H01L 25/0653; H01L 2224/32226; H01L 224/162225; H01L 2224/73265; H01L 25/18; H01L 25/16; H01L 23/36; H01L 23/42; H01L 23/49811; H01L 23/50; H01L 23/5385; H01L 2924/3511; H01L 2924/15311; H01L 2924/16195; H01L 2924/1434; H01L 2924/19041; H01L 2924/19042; H01L 2924/19106; H01L 2224/16225; H01L 2224/73253; H01L 2224/32245

See application file for complete search history.

(56) References Cited

U.S. PATENT DOCUMENTS 5,359,496 A  * 10/1994  Kornrumpf ............. H01L 23/04
                                                        257/E21.505
5,475,565 A  * 12/1995  Bhattacharyya et al. .... 361/719
(Continued)

FOREIGN PATENT DOCUMENTS

WO    2012055781 A1    5/2012
WO    2014078133 A1    5/2014

OTHER PUBLICATIONS

Hennessy, "VLSI Processor Architecture", 1984, IEEE Transaction on computers, vol. c-33, No. 12, pp. 1221-1246, Dec. 1984.*
(Continued)

*Primary Examiner* — Nikolay Yushin
(74) *Attorney, Agent, or Firm* — Muncy, Geissler, Olds & Lowe, P.C.

(57) ABSTRACT

A hybrid package having a processor module disposed on a substrate and an auxiliary module disposed on a patterned lid. The auxiliary module may be a memory module, a power management integrated circuit (PMIC) module, and/or other suitable module, that are located in the package along with the processor module. Having the auxiliary module in the package with the processor module reduces the noise at the solder bump between the processor module and the substrate. Having the auxiliary module in the package with the processor module also allows other modules to (Continued)

be added to the package without increasing the area of the package.

25 Claims, 11 Drawing Sheets

(51) Int. Cl.
    *H01L 23/42*     (2006.01)
    *H01L 23/36*     (2006.01)
    *H01L 25/16*     (2006.01)
    *H01L 25/18*     (2006.01)
    *H01L 23/498*     (2006.01)
    *H01L 23/50*     (2006.01)
    *H01L 23/538*     (2006.01)

(52) U.S. Cl.
    CPC .......... *H01L 23/50* (2013.01); *H01L 23/5385* (2013.01); *H01L 25/16* (2013.01); *H01L 25/18* (2013.01); *H01L 2224/16225* (2013.01); *H01L 2224/32245* (2013.01); *H01L 2224/73253* (2013.01); *H01L 2924/1434* (2013.01); *H01L 2924/15311* (2013.01); *H01L 2924/16195* (2013.01); *H01L 2924/19041* (2013.01); *H01L 2924/19042* (2013.01); *H01L 2924/19106* (2013.01); *H01L 2924/3511* (2013.01)

(56) References Cited

U.S. PATENT DOCUMENTS

| | | | |
|---|---|---|---|
| 5,587,882 A * | 12/1996 | Patel | .............................. 361/705 |
| 6,166,908 A * | 12/2000 | Samaras | ............ H05K 7/20336 |
| | | | 165/104.33 |
| 6,616,908 B2 | 9/2003 | Watson et al. | |
| 6,885,563 B2 * | 4/2005 | Panella et al. | ................. 361/794 |
| 7,115,988 B1 | 10/2006 | Hool | |
| 7,297,399 B2 * | 11/2007 | Zhang | ..................... F28F 13/00 |
| | | | 361/704 |
| 8,525,326 B2 | 9/2013 | Toong et al. | |
| 8,598,698 B1 | 12/2013 | Lim | |
| 8,704,384 B2 * | 4/2014 | Wu | ........................ H01L 23/147 |
| | | | 257/48 |
| 2003/0193791 A1* | 10/2003 | Panella et al. | ................. 361/764 |
| 2005/0051889 A1 | 3/2005 | Wood et al. | |
| 2008/0021970 A1 | 1/2008 | Werndorfer et al. | |
| 2008/0218970 A1* | 9/2008 | Kehret et al. | ................. 361/699 |
| 2009/0057867 A1 | 3/2009 | Hool | |
| 2011/0018119 A1 | 1/2011 | Kim et al. | |
| 2011/0233674 A1* | 9/2011 | Sleight et al. | ................. 257/347 |
| 2012/0112352 A1 | 5/2012 | Chi et al. | |
| 2013/0003310 A1 | 1/2013 | Raj et al. | |
| 2013/0214432 A1* | 8/2013 | Wu | ........................ H01L 23/147 |
| | | | 257/782 |

OTHER PUBLICATIONS

Wallin, "Heat Pipe, selection of working fluid", 2012, MVK100 Heat and Mass Transfer, pp. 1-7, May 2012.*
International Search Report and Written Opinion—PCT/US2015/035398—ISA/EPO—Sep. 17, 2015.

* cited by examiner

POWER MANAGEMENT INTEGRATED CIRCUIT (PMIC) INTEGRATION INTO A PROCESSOR PACKAGE

FIELD OF DISCLOSURE

Aspects of the present disclosure relate generally to integrated circuit packaging and in particular to integrating a power management integrated circuit (PMIC) into a processor package.

BACKGROUND

Conventional processor packages have a processor flip chip device mounted on a package substrate. On the back of the processor device is a heat spreader to remove heat from the device. On top of the heat spreader there is a heat sink to remove the heat even further. The processor package is mounted to a printed circuit board (PCB).

Also mounted to the PCB is a power management integrated circuit (PMIC). The PMIC is usually mounted some distance away from the processor die so that it can be easily removed if it fails. That is, the PMIC is not integrated with the processor package.

One problem with having the PMIC located at a distance from the processor package is that noise is present at the solder bump or solder joint where the processor die is mounted to the substrate. another problem with having the PMIC located at a distance from the processor package is that a significant number of package pins are allocated for processor power rails Therefore, improved apparatuses and methods for reducing noise in a processor package are needed.

SUMMARY

Example implementations of the technology described herein are directed to a hybrid integrated circuit (IC) package having a processor module disposed on a package substrate and an auxiliary module disposed on a patterned lid. The auxiliary module may be a memory module, a power management integrated circuit (PMIC) module, and/or other suitable module, such as an input/output (I/O) or connectivity related module, that are located in the package along with the processor module. Having the auxiliary module in the package with the processor module reduces the noise at the connections between the processor module and the substrate.

In one or more implementations, an apparatus includes a processor module, an auxiliary module, and a patterned lid. The auxiliary module is at least one of a memory or a power management integrated circuit (PMIC). The processor module and the auxiliary module are coupled to the patterned lid. Thermal interface material (TIM) may be disposed on the patterned lid and on at least one of the processor module or the auxiliary module. The apparatus also may include a substrate and an interposer coupled to the substrate and the auxiliary module.

The apparatus also may include a printed circuit board (PCB) coupled to the substrate, at least two interconnecting elements coupled between the patterned lid and the substrate, and a passive component disposed on the interposer and coupled to the auxiliary module. The passive component may be coupled to the auxiliary module using at least one through-substrate via (TSV). At least one decoupling capacitor may be coupled to the patterned lid.

In alternative implementations, a method of manufacturing an integrated circuit (IC) package comprises providing a processor module, providing an auxiliary module, providing a patterned lid, and coupling the processor module and the auxiliary module to the patterned lid. The auxiliary module is at least one of a memory or a power management integrated circuit (PMIC).

The method further includes disposing thermal interface material (TIM) on the patterned lid and on at least one of the processor module or the auxiliary module, providing a substrate, providing an interposer, coupling the interposer to the substrate and the auxiliary module, providing a printed circuit board (PCB), and coupling the printed circuit board (PCB) to the substrate, coupling at least two interconnecting elements between the patterned lid and the substrate. The method further includes disposing a passive component on the interposer and coupling the passive component to the auxiliary module. Coupling the passive component to the auxiliary module may be accomplished using at least one through-substrate via (TSV). The method also includes providing at least one decoupling capacitor and coupling the decoupling capacitor to the patterned lid.

In still other implementations, a computer-readable storage medium includes data that, when accessed by a machine, cause the machine to perform operations comprising providing a processor module, providing an auxiliary module, providing a patterned lid, and coupling the processor module and the auxiliary module to the patterned lid. The auxiliary module is at least one of a memory or a power management integrated circuit (PMIC). The computer-readable storage medium may be a non-transitory computer-readable storage medium.

In one or more alternative implementations, an apparatus includes a processor module, an auxiliary module, and a patterned lid. The auxiliary module is at least one of a memory module or a power management integrated circuit (PMIC) module. The apparatus includes means for coupling the processor module and the auxiliary module to the patterned lid. The means for coupling the processor module and the auxiliary module to the patterned lid includes means for thermally coupling the processor module and the auxiliary module to the patterned lid. The means for thermally coupling the processor module and the auxiliary module to the patterned lid includes a thermally conductive adhesive.

The means for coupling the processor module and the auxiliary module to the patterned lid also includes means for electrically coupling the processor module and the auxiliary module to the patterned lid. The means for electrically coupling the processor module and the auxiliary module to the patterned lid includes solder.

The means for coupling the processor module and the auxiliary module to the patterned lid includes means for mechanically coupling the processor module and the auxiliary module to the patterned lid.

Above is a simplified Summary relating to one or more implementations described herein. As such, the Summary should not be considered an extensive overview relating to all contemplated aspects and/or implementations, nor should the Summary be regarded to identify key or critical elements relating to all contemplated aspects and/or implementations or to delineate the scope associated with any particular aspect and/or implementation. Accordingly, the Summary has the sole purpose of presenting certain concepts relating to one or more aspects and/or implementations relating to the mechanisms disclosed herein in a simplified form to precede the detailed description presented below.

BRIEF DESCRIPTION OF THE DRAWINGS

The accompanying drawings are presented to aid in the description of the technology described herein and are provided solely for illustration of the implementations and not for limitation of the implementations.

DETAILED DESCRIPTION

Figure 1:
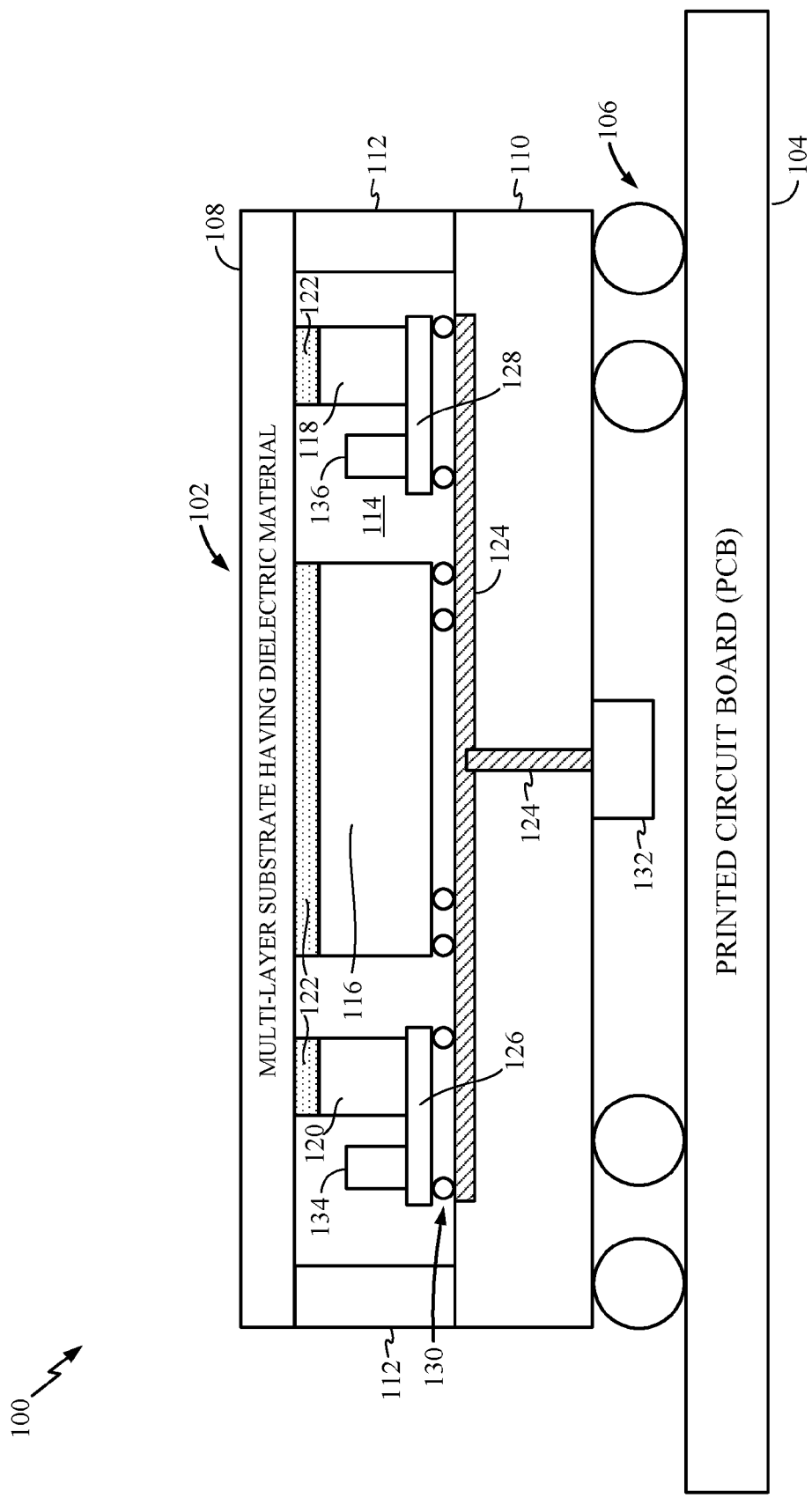
FIG. 1 is a cross-section view of an integrated circuit (IC) according to one or more implementations of the technology described herein.

In general, the subject matter disclosed herein is directed to hybrid integrated circuit (IC) packages that use a patterned lid as a module carrier. In one or more implementations, the patterned lid is a module carrier that provides additional space to attach more die and/or auxiliary modules that conventionally would be located away from the IC package and on the associated printed circuit board (PCB). For example, the power management integrated circuit (PMIC) is now integrated with the processor module in the hybrid integrated circuit (IC) package, and other modules are added to the hybrid integrated circuit (IC) package without increasing the area of the hybrid integrated circuit (IC) package.

One advantage of integrating the power management integrated circuit (PMIC) or other auxiliary modules in the hybrid integrated circuit (IC) package and/or using the patterned lid as a decoupling capacitor is that direct current (DC) and dynamic noise that is present at the solder bump or solder joint where the processor die is mounted to the hybrid integrated circuit (IC) package substrate is significantly reduced. Because the hybrid package includes both a processor module and one or more auxiliary modules, the distance between the processor module and auxiliary modules is lessened.

As described above, conventionally the processor package is mounted to the printed circuit board (PCB) and the auxiliary modules also are mounted to the PCB, but at some distance away from the processor package. With implementations of the technology described herein the distance between the processor module and auxiliary modules can be reduced to a few millimeters. Because the distance between the processor module and auxiliary modules is lessened, the noise in the integrated circuit (IC) is reduced.

Because the hybrid package includes both the processor module and the auxiliary modules, the distance between the processor module and auxiliary modules is lessened. The distance can be reduced to a few millimeters. Because the distance between the processor module and auxiliary modules is lessened, the noise in the integrated circuit (IC) is reduced.

Another advantage of having the power management integrated circuit (PMIC) or other auxiliary modules included in the hybrid integrated circuit (IC) package is that power pin count may be reduced significantly because (1) current input to the hybrid package may be drastically reduced while voltage is increased, keeping the power the same and (2) a pin has much more current carrying capability than voltage level limitation. Moreover, the processor module pin count may be significantly reduced because the power management integrated circuit (PMIC) output high current, low voltage nets don't need to enter into the package since they are replaced by power management integrated circuit (PMIC) input higher voltage and lower current pins which needs fewer pins. Also once memory chips are integrated into the processor package, all the memory interface pins can be eliminated from the processor package pins since those are now processor package internal nets.

In one or more implementations, the hybrid IC package includes a processor module and two auxiliary modules that are mechanically and thermally coupled to a patterned lid. One of the auxiliary modules is the power management integrated circuit (PMIC) and the other auxiliary module is a memory module. The processor module and the two auxiliary modules are thermally coupled to the patterned lid using a thermal interface material (TIM). The thermal interface material (TIM) may be an anisotropic thermally conductive adhesive that allows the lid to function as a heat spreader to remove/dissipate heat from the hybrid integrated circuit (IC) package. In this and other implementations, the processor module and the two auxiliary modules are not electrically coupled to the patterned lid. However, the processor module and the two auxiliary modules are electrically coupled to each other using wiring and circuitry on a substrate of the hybrid integrated circuit (IC) package.

In one or more alternative implementations, the hybrid IC package includes a processor module, one auxiliary module, and one passive component, which is associated with the auxiliary module. The processor module and auxiliary module are mechanically, electrically, and thermally coupled to a patterned lid. The auxiliary modules may be the power management integrated circuit (PMIC). The processor module and the auxiliary module are thermally coupled to the patterned lid using a thermal interface material (TIM). The thermal interface material (TIM) may be an anisotropic thermally conductive adhesive that allows the lid to function as a heat spreader to remove/dissipate heat from the hybrid integrated circuit (IC) package.

In this and other implementations, the processor module, the auxiliary module, and the passive component are electrically coupled to the patterned lid. The auxiliary module includes through substrate vias (TSVs) that electrically couple the auxiliary module to the passive component through the patterned lid.

The patterned lid is a multilayer substrate that includes a copper plate having a dielectric material that is patterned with vias and interconnects so that the processor module, the auxiliary module, and the passive component can electrically couple to the patterned lid and with each other. In one or more implementations, patterning of the carrier/lid can be by laminate, printing, spin-off, etc., to make the carrier/lid a multilayer substrate.

In still another implementation, the hybrid IC package includes a processor module and two auxiliary modules. The processor module is thermally, mechanically, and electrically coupled to the patterned lid. The patterned lid is a multilayer substrate that includes a copper plate having a dielectric material that is patterned with vias and interconnects so that the processor module and the auxiliary modules can electrically couple to the patterned lid and to each other. The auxiliary modules are mechanically and electrically coupled to the patterned lid. One of the auxiliary modules is the PMIC and the other auxiliary module is a memory module. The processor module is thermally coupled to the patterned lid using an anisotropic thermally conductive adhesive that allows the lid to function as a heat spreader to remove/dissipate heat from the hybrid integrated circuit (IC) package.

In one or more implementations, the patterned lid and the package substrate may be coupled to each other through a substrate using solder ball. The patterned lid and the package substrate may be coupled through a patterned stiffener using anisotropic conductive adhesive. Alternatively still, the patterned lid and the package substrate may be coupled through a socket.

Processor Module and Auxiliary Modules Thermally/Mechanically Coupled to Patterned Lid FIG. 1 is a cross-section view of an integrated circuit (IC) assembly 100 according to one or more implementations of the technology described herein in which a processor module and auxiliary modules are thermally and mechanically coupled to a patterned lid but not electrically coupled to the patterned lid. In one or more implementations, the integrated circuit (IC) assembly 100 may be part of a high-performance multichip module (MCM).

The illustrated integrated circuit (IC) assembly 100 includes a hybrid integrated circuit (IC) package 102 mounted to a printed circuit board (PCB) 104 using solder balls 106. The illustrated integrated circuit (IC) assembly 100 includes a patterned lid 108 that is coupled to a substrate 110 using interconnecting elements 112. The patterned lid 108, substrate 110, and interconnecting elements 112 form a cavity 114 within the illustrated integrated circuit (IC) assembly 100.

The illustrated integrated circuit (IC) assembly 100 includes a processor module 116, an auxiliary module 118, and an auxiliary module 120 disposed in the cavity 114. The illustrated integrated circuit (IC) assembly 100 includes a thermal interface material (TIM) 122 disposed on the patterned lid 108. The illustrated integrated circuit (IC) assembly 100 includes circuitry/wiring 124 disposed in and/or on the substrate 110.

The illustrated integrated circuit (IC) assembly 100 includes an interposer 126 and an interposer 128 disposed in the cavity 114. The interposer 126, the interposer 128, and the processor module 116 are coupled to the circuitry/wiring 124 that is disposed in and/or on the substrate 110 using solder balls 130.

The illustrated integrated circuit (IC) assembly 100 includes an optional decoupling capacitor 132 coupled to the circuitry/wiring 124 disposed in and/or on the substrate 110.

The illustrated integrated circuit (IC) assembly 100 includes a passive component 134 that is disposed on the interposer 126 and associated with the auxiliary module 120. The illustrated integrated circuit (IC) assembly 100 includes a passive component 136 that is disposed on the interposer 128 and associated with the auxiliary module 118.

In one or more implementations, the integrated circuit (IC) assembly 100 may be any suitable integrated circuit. For example, the integrated circuit (IC) assembly 100 may operate in a high speed, high current scenario, such as in a server environment. Alternatively, the integrated circuit (IC) assembly 100 may operate in a user device, such as a mobile phone, a base station, or other communication environment. Additionally, the integrated circuit (IC) assembly 100 may be a ball grid array (BGA) package, a land grid array (LGA) package, and/or a ceramic-based package.

In one or more implementations, the hybrid integrated circuit (IC) package 102 may be any suitable semiconductor package that provides protection for the processor module 116, the auxiliary modules 118 and 120, and the circuitry/wiring 124 against impact and corrosion. The hybrid integrated circuit (IC) package 102 also may hold contact pins or leads that are used to couple external circuits to the processor module 116, the auxiliary modules 118 and 120, and the circuitry/wiring 124. In addition to the patterned lid 108, the hybrid integrated circuit (IC) package 102 may be used to dissipate heat produced in the processor module 116, the auxiliary modules 118 and 120, and the circuitry/wiring 124.

In one or more implementations, the printed circuit board (PCB) 104 is any device that provides a platform that mechanically supports the components thereon, including solder balls, solder pads, sockets, electrical traces, and the like.

In one or more implementations, the solder balls 106 may be actual solder balls, solder bumps, or any suitable means to electrically couple the hybrid integrated circuit (IC) package 102 to the printed circuit board (PCB) 104

In one or more implementations, the patterned lid 108 is a multilayer substrate that includes a copper plate having a dielectric material that is patterned with vias and interconnects so that the processor module 116 and the auxiliary modules 118 and 120 can electrically couple to the patterned lid and with each other. In one or more implementations, patterning of the carrier/lid can be by laminate, printing, spin-off, etc., to make the patterned lid 108 a multilayer substrate.

In one or more implementations, the patterned lid 108 also may function as a heat sink and/or integrated heat spreader for the hybrid integrated circuit (IC) package 102. The illustrated patterned lid 108 is thermally coupled to the backside of the processor module 116, and to the backsides of the auxiliary modules 118 and 120.

In one or more implementations, the substrate 110 may be a silicon substrate or other suitable substrate.

In one or more implementations, the interconnecting elements 112 may be stiffeners or other suitable mechanisms, that control warping in the hybrid integrated circuit (IC) package 102, for example. In one or more implementations, the interconnecting elements 112 may be decoupling capacitors for the hybrid integrated circuit (IC) package 102. In an alternative implementation, the interconnecting elements 112 may be stiffeners that couple the patterned lid 108 to the substrate 110 through anisotropic conductive adhesive or ball.

In one or more implementations, the cavity 114 holds the processor module 116, the auxiliary modules 118 and 120, the interposers 126, and 128, and the passive components 134 and 136. Conventionally, the auxiliary modules 118 and 120, the interposers 126, and 128, and the passive components 134 and 136 would not be located in the cavity 114. Instead, the auxiliary modules 118 and 120, the interposers 126, and 128, and the passive components 134 and 136 would be located on the printed circuit board (PCB) 104 at a distance from the processor module 116. As described above, because the hybrid integrated circuit (IC) package 102 includes both the processor module 116 and the auxiliary modules 118 and 120, the distance between the modules is lessened and the noise in the hybrid integrated circuit (IC) package 102 is reduced.

In one or more implementations, the processor module 116 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The processor module 104 may be used for processing information. The processor module 104 can be supplemented by, or incorporated in, special purpose logic circuitry.

In one or more implementations, the auxiliary module 118 may be a power management integrated circuit (PMIC). In this and other implementations, the power management integrated circuit (PMIC) module provides DC-DC conversion, and/or other mechanisms for managing power in the integrated circuit (IC) assembly 100. Moreover, the auxiliary module 118, as the power management integrated circuit (PMIC), has output high current, low voltage nets. In this implementation, the pin count can be reduced because in the netlist does not enter into the hybrid integrated circuit (IC) package 102. This is because the output high current, low voltage nets are replaced by the auxiliary module 118 input high voltage, and lower current pins, which may utilize fewer pins.

In one or more implementations, the auxiliary module 120 may be a memory module. In this and other implementations, the memory module may be any suitable memory module, such as a Random Access Memory (RAM), a Read Only Memory (ROM), or any other suitable storage device used for storing information, a computer program, and/or instructions to be executed by the processor module 116. In implementations in which the auxiliary module 120 is a memory module, the memory interface pins may be eliminated from the processor module 116 pins because the memory interface pins become processor module 116 internal nets on the netlist.

In one or more implementations, the thermal interface material (TIM) 122 may be may be any thermally conductive material, such as an anisotropic thermally conductive adhesive material. In this implementation, the thermal interface material (TIM) 122 may have anisotropic thermal conductivity that allows the patterned lid 108 to function as a heat spreader to remove/dissipate heat from the hybrid integrated circuit (IC) package 102.

In one or more implementations, the circuitry/wiring 124 is disposed in and/or on the substrate 110. The processor module 116 is electrically and mechanically coupled to the circuitry/wiring 124 using the solder balls 130.

In one or more implementations, the interposer 126 is disposed in and/or on the substrate 110. The interposer 126 is electrically and mechanically coupled to the circuitry/wiring 124 using the solder balls 130. The interposer 126 carries the auxiliary module 120.

In one or more implementations, the interposer 128 also is disposed in and/or on the substrate 110. The interposer 128 is electrically and mechanically coupled to the circuitry/wiring 124 using the solder balls 130. The interposer 126 carries the auxiliary module 118.

In one or more implementations, the solder balls 130 may be any suitable electrical and mechanical interconnector such as solder bumps or the like.

In one or more implementations, the optional decoupling capacitor 132 provides additional stability to the power supplied to the processor module 116, the auxiliary modules 118 and 120, and the passive components 134 and 136.

In this implementation, the passive component 134 may be a capacitor, inductor, or other suitable passive component that is associated with the auxiliary module 118.

In this implementation, the passive component 136 may be a capacitor, inductor, or other suitable passive component that is associated with the auxiliary module 120.

In one or more implementations, the hybrid integrated circuit (IC) package 102 is assembled without the processor module 116. This allows the hybrid integrated circuit (IC) package 102 to be tested to determine whether or not the auxiliary modules 118 and 120 can be verified as known good dies (KGDs). This is advantages because commonly, the processor module 116 is quite a bit more expensive than the auxiliary modules 118 and 120. Using the technology described herein, once the auxiliary modules 118 and 120 are verified as known good dies (KGDs) the processor module 116 can be installed in the cavity 114 and burn-in can be performed.

Figure 2:
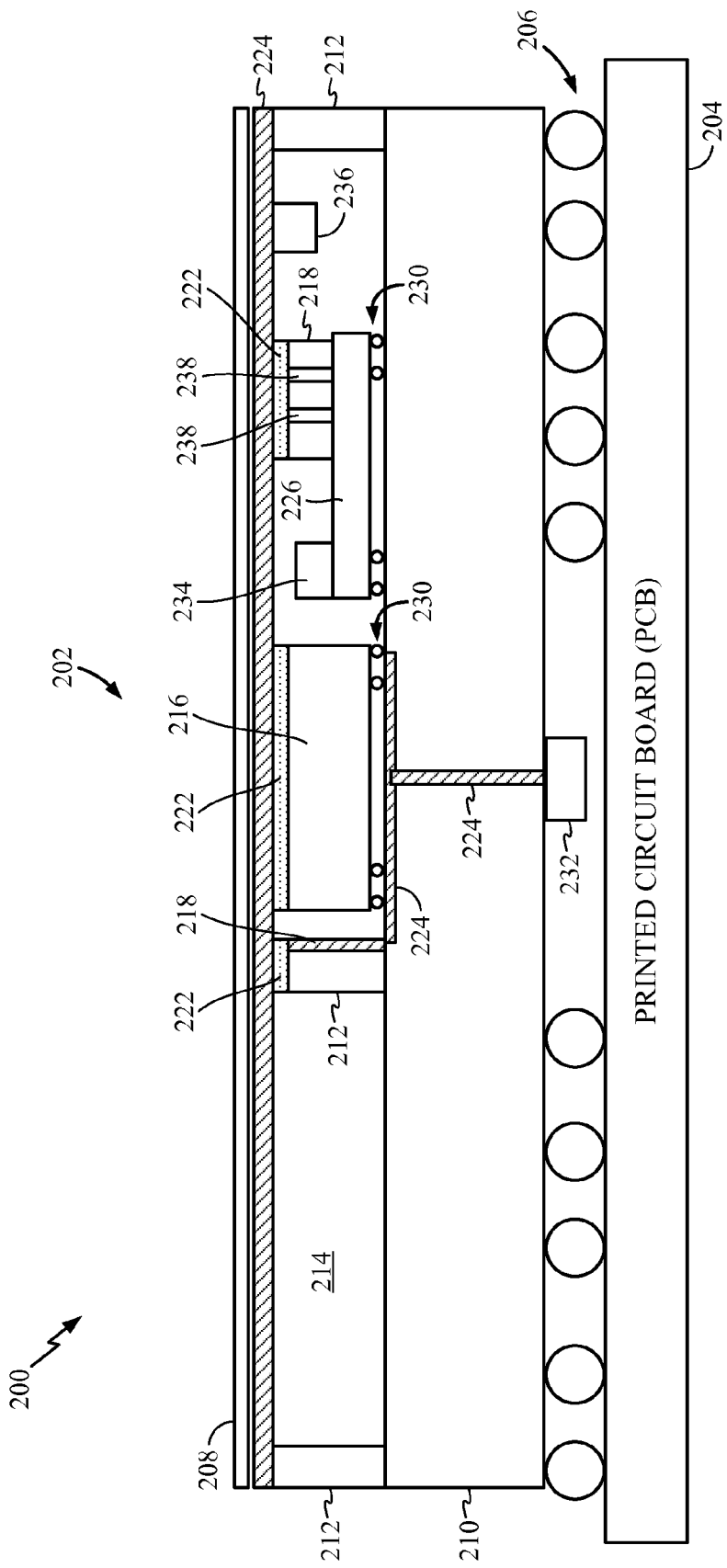
FIG. 2 is a cross-section view of an integrated circuit (IC) according to one or more alternative implementations of the technology described herein.

Processor Module and Auxiliary Module
Electrically/Thermally/Mechanically Coupled to
Patterned Lid FIG. 2 is a cross-section view of an integrated circuit (IC) assembly 200 according to one or more implementations of the technology described herein that is similar to the integrated circuit (IC) assembly 100. One difference is that in the integrated circuit (IC) assembly 200, the processor module, a single auxiliary module, and a single passive component are electrically, thermally, and mechanically coupled to a patterned lid. Another difference is that there is more area in the cavity for other components because only a single auxiliary module and a single interposer are used. An additional difference is that there is an extra interconnecting element The illustrated integrated circuit (IC) assembly 200 includes a hybrid integrated circuit (IC) package 202 mounted to a printed circuit board (PCB) 204 using solder balls 206. The illustrated integrated circuit (IC) assembly 200 includes a patterned lid 208 that is coupled to a substrate 210 using interconnecting elements 212. The patterned lid 208, substrate 210, and interconnecting elements 212 form a cavity 214 within the illustrated integrated circuit (IC) assembly 200.

The illustrated integrated circuit (IC) assembly 200 includes a processor module 216 and an auxiliary module 218 disposed in the cavity 214. The illustrated integrated circuit (IC) assembly 200 includes a thermal interface material (TIM) 222 disposed on the patterned lid 208. The illustrated integrated circuit (IC) assembly 200 includes circuitry and/or wiring 224 disposed in and/or on the substrate 210.

The illustrated integrated circuit (IC) assembly 200 includes an interposer 226 disposed in the cavity 214. The interposer 226 and the processor module 216 are coupled to the circuitry and/or wiring 224 that is disposed in and/or on the substrate 210 using solder balls/bumps 230.

The illustrated integrated circuit (IC) assembly 200 includes an optional decoupling capacitor 232 coupled to the circuitry and/or wiring 224 disposed in and/or on the substrate 210.

The illustrated integrated circuit (IC) assembly 200 includes a passive component 234 that is disposed on the interposer 226 and associated with the auxiliary module 220. The illustrated integrated circuit (IC) assembly 200 also includes a passive component 236 that is disposed on the patterned lid 208 and associated with the auxiliary module 218.

The illustrated auxiliary module 218 is electrically coupled to the passive component 236 that is coupled to the patterned lid 208 through through-substrate vias (TSVs) and the anisotropic thermal interface material (TIM) 222.

In one or more implementations, the auxiliary module 218 may be a power management integrated circuit (PMIC). In this and other implementations, the power management integrated circuit (PMIC) module provides DC-DC conversion, and/or other mechanisms for managing power in the integrated circuit (IC) assembly 200. Moreover, the auxiliary module 218, as the power management integrated circuit (PMIC), has output high current, low voltage nets. In this implementation, the pin count can be reduced because in the netlist does not enter into the hybrid integrated circuit (IC) package 202. This is because the output high current, low voltage nets are replaced by the auxiliary module 218 input high voltage, and lower current pins, which may utilize fewer pins.

Additionally, when the auxiliary module 218 is the power management integrated circuit (PMIC), the passive component 234 may be an inductor and the passive component 236 may be a decoupling capacitor. Although a single passive component 236 is shown, more than one passive component may be placed on the patterned lid 208 and coupled to the auxiliary module 218 through the through-substrate vias (TSVs) and the anisotropic thermal interface material (TIM) 222.

Figure 3:
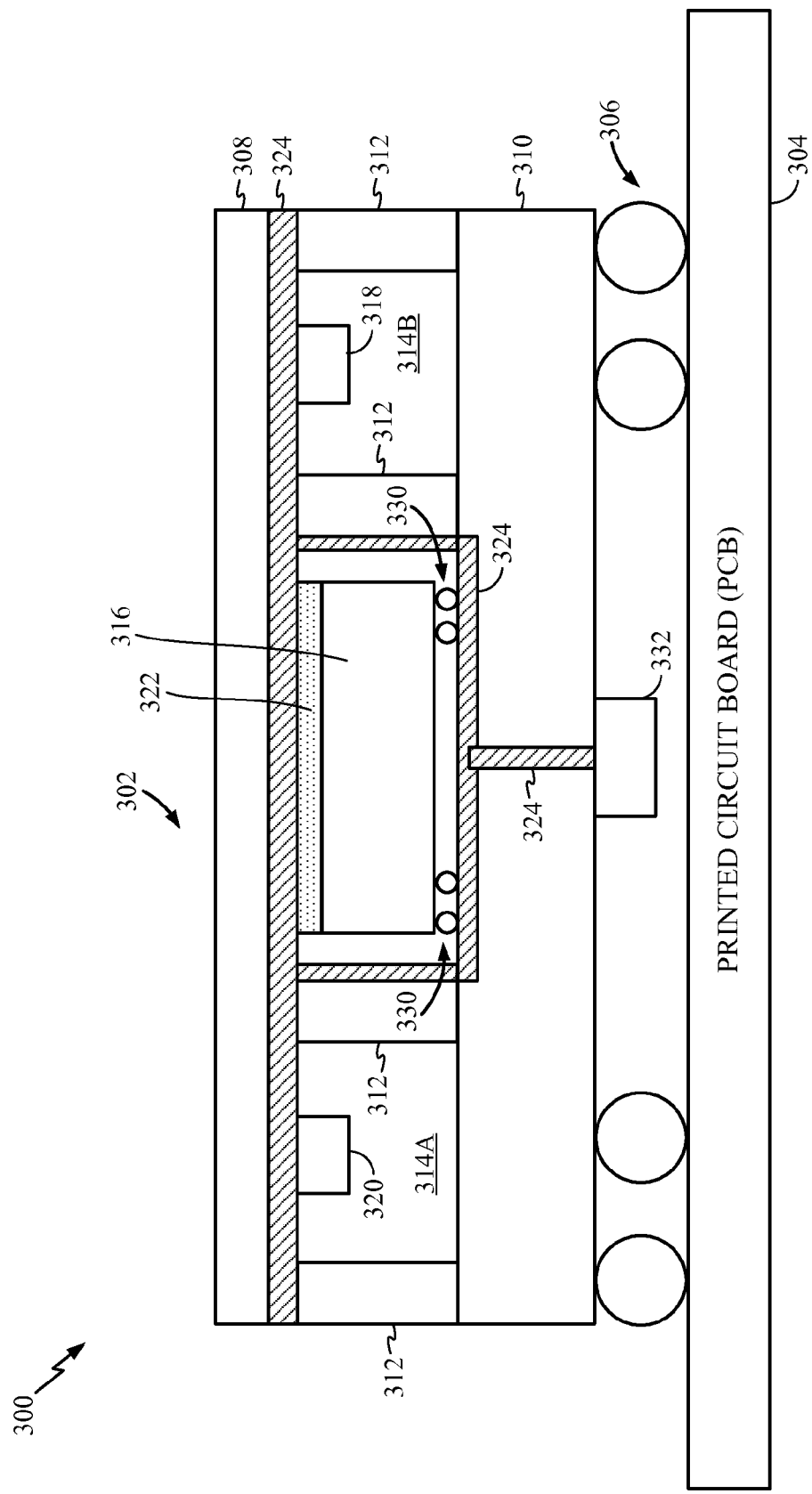
FIG. 3 is a cross-section view of an integrated circuit (IC) according to another alternative implementation of the technology described herein.

Processor Module and Auxiliary Modules
Electrically/Mechanically Coupled to Patterned Lid FIG. 3 is a cross-section view of an integrated circuit (IC) assembly 300 according to one or more implementations of the technology described herein that is similar to the integrated circuit (IC) assembly 100 and the integrated circuit (IC) assembly 200. In the integrated circuit (IC) assembly 300, the processor module, and two auxiliary modules are electrically and mechanically coupled to a patterned lid. However, the two auxiliary modules are not thermally coupled to the patterned lid. Also, there are no passive components in the integrated circuit (IC) assembly 300. Another difference is that there is more area in the cavity for other components because no interposers are used. An additional difference is that there are two extra interconnecting elements disposed close to processor module in addition to the standard interconnecting elements on the edges of the package. These inside stiffeners couple the patterned lid, processor chip, and auxiliary modules to each other and to the circuitry/wiring in the integrated circuit (IC) assembly 300 using solder bumps on the processor module.

The illustrated integrated circuit (IC) assembly 300 includes a hybrid integrated circuit (IC) package 302 mounted to a printed circuit board (PCB) 304 using solder balls 306. The illustrated integrated circuit (IC) assembly 300 includes a patterned lid 308 that is coupled to a substrate 310 using interconnecting elements 312. The patterned lid 308, the substrate 310 and the interconnecting elements 312 form a cavity 314 within the illustrated integrated circuit (IC) assembly 300.

The illustrated integrated circuit (IC) assembly 300 includes a processor module 316, an auxiliary module 318, and an auxiliary module 320 disposed in the cavity 314. The illustrated integrated circuit (IC) assembly 300 includes a thermal interface material (TIM) 322 disposed on the patterned lid 308. The illustrated integrated circuit (IC) assembly 300 includes circuitry and/or wiring 324 disposed in and/or on the substrate 310.

The illustrated processor module 316 is coupled to the circuitry and/or wiring using the solder balls 330.

The illustrated auxiliary module 318 and the auxiliary module 320 are electrically coupled to the processor module 316 using the anisotropic thermal interface material (TIM) 322.

The illustrated integrated circuit (IC) assembly 300 includes an optional decoupling capacitor 332 coupled to the circuitry and/or wiring 324 disposed in and/or on the substrate 310.

In one or more implementations, the auxiliary module 318 may be a power management integrated circuit (PMIC). In this and other implementations, the power management integrated circuit (PMIC) module provides DC-DC conversion, and/or other mechanisms for managing power in the integrated circuit (IC) assembly 300. Moreover, the auxiliary module 318, as the power management integrated circuit (PMIC), has output high current, low voltage nets. In this implementation, the pin count can be reduced because in the netlist does not enter into the hybrid integrated circuit (IC) package 302. This is because the output high current, low voltage nets are replaced by the auxiliary module 318 input high voltage, and lower current pins, which may utilize fewer pins.

In one or more implementations, the auxiliary module 320 may be a memory module. In this and other implementations, the memory module may be any suitable memory module, such as a Random Access Memory (RAM), a Read Only Memory (ROM), or any other suitable storage device used for storing information, a computer program, and/or instructions to be executed by the processor module 316. In implementations in which the auxiliary module 320 is a memory module, the memory interface pins may be eliminated from the processor module 316 pins because the memory interface pins become processor module 316 internal nets on the netlist.

Patterned Lid Fabrication Methods

Recall from the description above that in one implementation the patterned lids may be a multilayer substrate that includes a copper plate having a dielectric material that is patterned with vias and interconnects so that the processor module. Patterning of the lid can be accomplished by laminate, printing, spin-off, etc.

Figure 4:
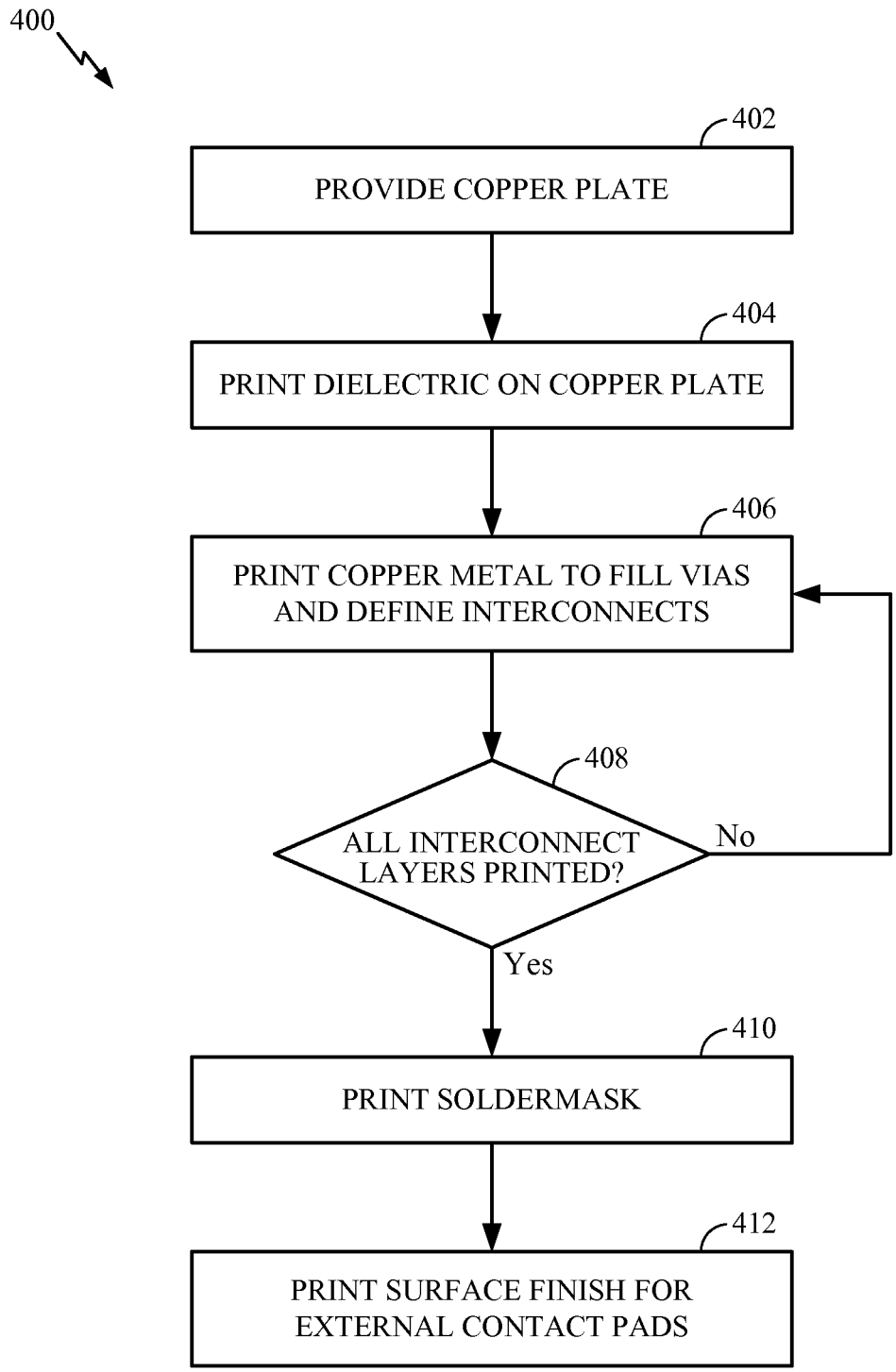
FIG. 4 is a flowchart illustrating a method of making a patterned carrier according to an implementation of the technology described herein.

FIG. 4 is a flowchart illustrating a method 400 of making a patterned lid that is a heat spreader according to an implementation of the technology described herein in which the patterning of the lid is accomplished by printing.

In a block 402, the method 400 provides a copper plate. In one or more implementations, the copper plate may be from around 1 to 1.5 millimeters thick.

In a block 404, the method 400 prints a dielectric on the copper plate. In one or more implementations, the method 400 avoids printing the dielectric in vias and/or cavities in the lid where the modules and passive components will be disposed.

In a block 406, the method 400 disposes copper metal on the copper plate to fill the vias and to define interconnects on the copper plate.

In a block 408, the method 400 determines whether all interconnect layers for the lid have been printed. If not, then the method 400 repeats block 406 until all interconnect layers for the lid have been printed.

If all interconnect layers for the lid have been printed, then in a block 410 the method 400 prints a solder mask on the copper plate, avoiding external contact pads and the or cavities in the lid where the modules and passive components will be disposed.

In a block 412, the method 400 prints a surface finish for the external contact pads. In one or more implementations, the surface finish may be created by depositing NiAu.

Figure 5:
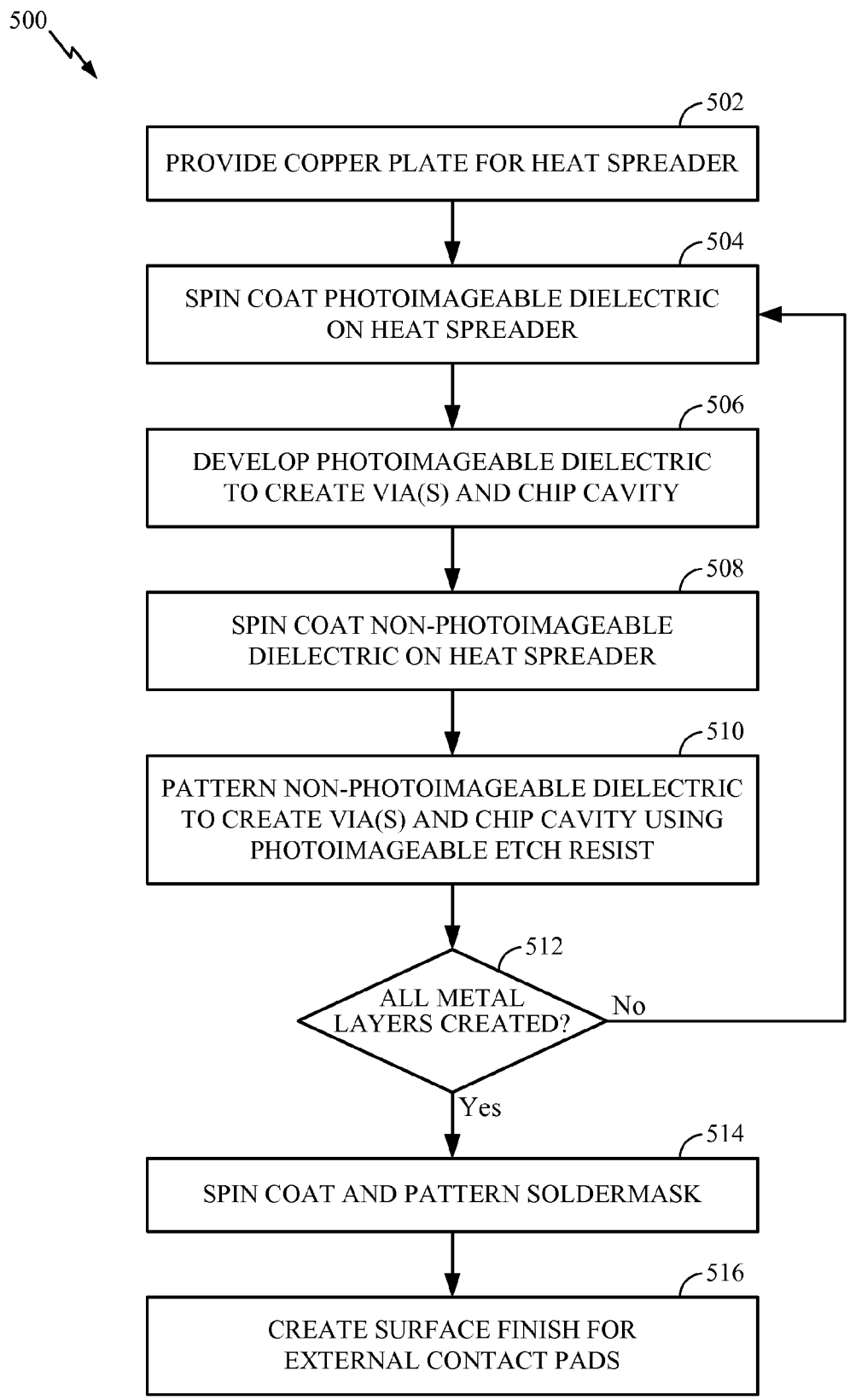
FIG. 5 is a flowchart illustrating a method of making a patterned carrier according to an alternative implementation of the technology described herein.

FIG. 5 is a flowchart illustrating a method 500 of making a patterned lid that is a heat spreader according to an implementation of the technology described herein in which the patterning of the lid is accomplished by spin-coating.

In a block 502, the method 500 provides a copper plate. In one or more implementations, the copper plate may be from around 1 to 1.5 millimeters thick.

In a block 504, the method 500 spin-coats a photo-imageable dielectric on the copper plate.

In a block 506, the method 500 develops the photo-imageable dielectric to create vias and/or cavities in the lid where the modules and passive components will be disposed.

In a block 508, the method 500 spin-coats a non-photo-imageable dielectric on the copper plate.

In a block 510, the method 500 patterns the non-photo-imageable dielectric on the copper plate to create vias and/or cavities in the lid where the modules and passive components will be disposed. In one or more implementations, the non-photo-imageable dielectric is patterned using a photo-imageable etch resist.

In a block 512, the method 500 determines whether all metal layers for the lid have been printed. If not, then the method 500 repeats block 504 until all metal layers for the lid have been printed.

If all interconnect layers for the lid have been printed, then in a block 514 the method 500 spin-coats and patterns a solder mask on the copper plate.

In a block 516, the method 500 prints a surface finish for the external contact pads. In one or more implementations, the surface finish may be created by depositing NiAu.

Figure 6:
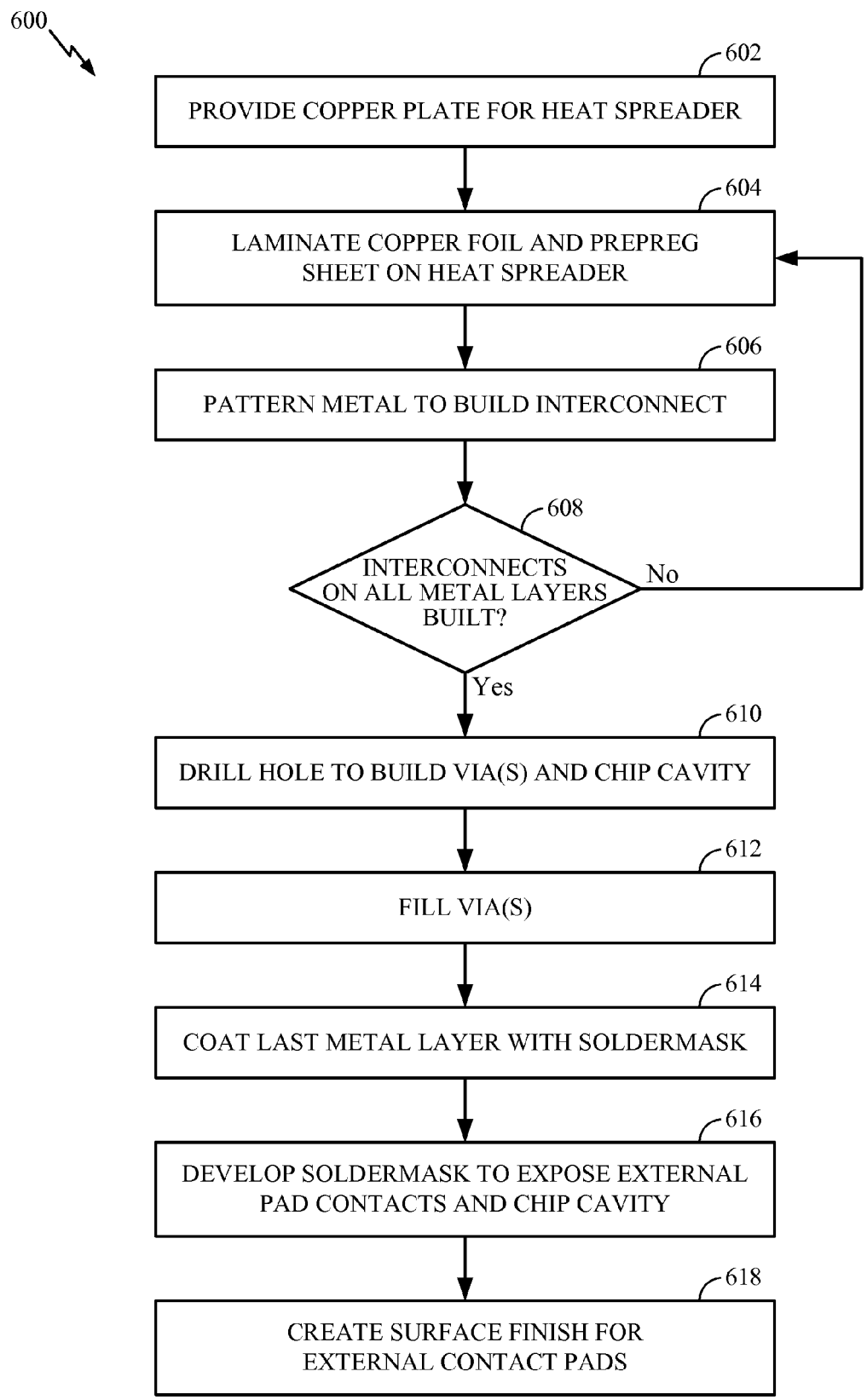
FIG. 6 is a flowchart illustrating a method of making a patterned carrier according to an alternative implementation of the technology described herein.

FIG. 6 is a flowchart illustrating a method 600 of making a patterned lid that is a heat spreader according to an implementation of the technology described herein in which the patterning of the lid is accomplished by laminating.

In a block 602, the method 600 provides a copper plate. In one or more implementations, the copper plate may be from around 1 to 1.5 millimeters thick.

In a block 604, the method 600 laminates a copper foil and a sheet of pre-impregnated fibers on the copper plate.

In a block 606, the method 600 patterns the copper foil to build interconnects on that layer copper foil and pre-impregnated fibers.

In a block 608, the method 600 determines whether all metal layers for the lid have been built. If not, then the method 600 repeats block 604 until all metal layers for the lid have been built.

If all interconnect layers for the lid have been built, then in a block 610 the method 600 drills a hole to build vias and/or cavities in the lid where the modules and passive components will be disposed. In one or more implementations, the method 600 may mechanically, optically, or chemically drill the holes.

In a block 612, the method 600 fills the holes. In one implementation, the method 600 fills the vias galvanically. In another implementation, the method 600 fills the vias using a copper plug.

In a block 614, the method 600 coats the last metal layer with a solder mask.

In a block 616, the method 600 develops the solder mask to expose external pad contacts and cavities in the lid where the modules and passive components will be disposed.

In a block 618, the method 600 creates a surface finish for the external contact pads. In one or more implementations, the surface finish may be created by depositing NiAu.

Integrated Circuit (IC) Assembly 100 Fabrication Method

Figure 7:
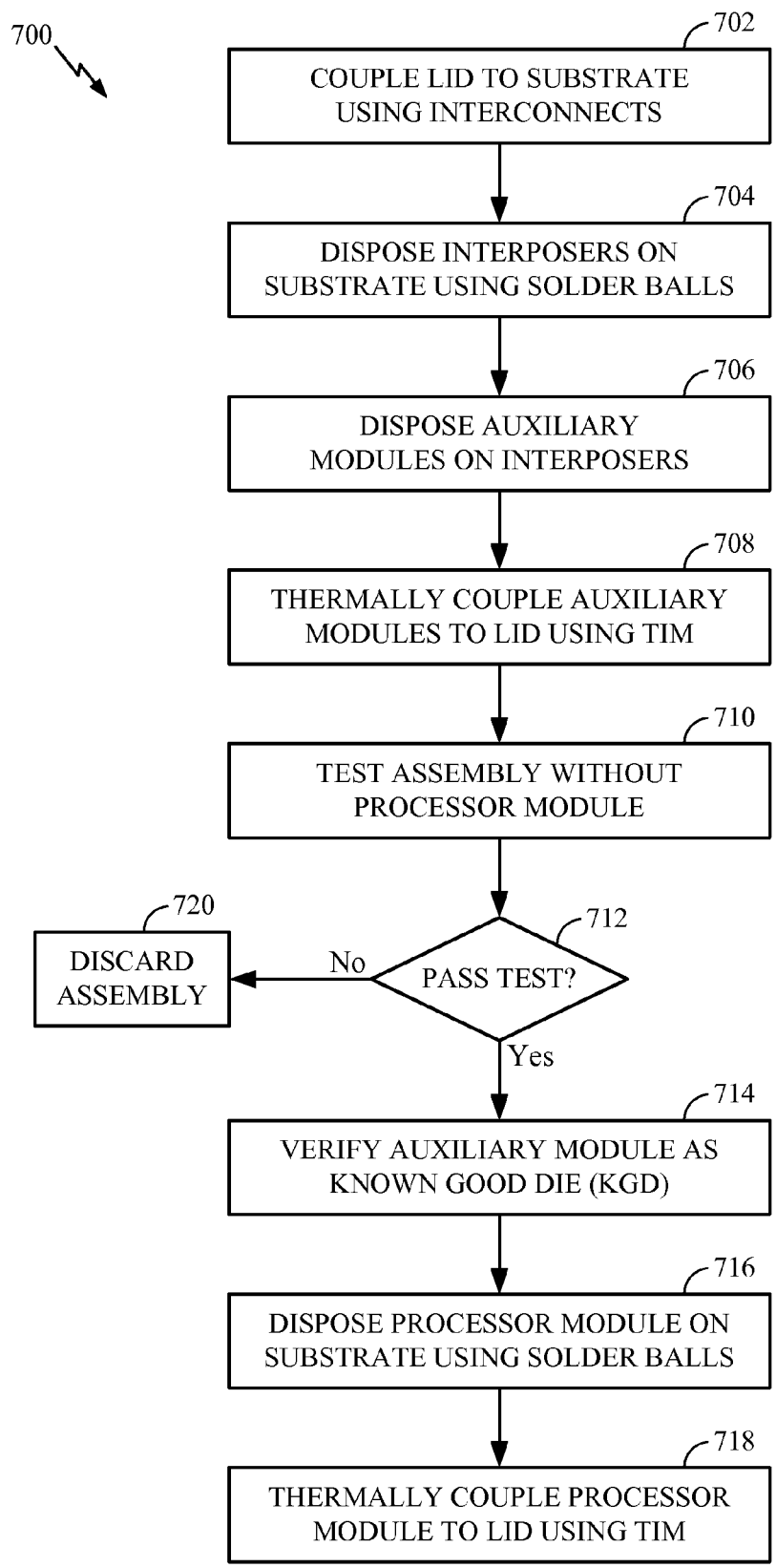
FIG. 7 is a flowchart illustrating a method of making an integrated circuit package according to an implementation of the technology described herein.

Recall from the description above that the integrated circuit (IC) assembly 100 includes a processor module, two auxiliary modules, two passive components, and two interposers. FIG. 7 is a flowchart illustrating a method of making the integrated circuit (IC) assembly 100 according to an implementation of the technology described herein.

In a block 702, the method 700 couples a lid to a substrate using interconnecting elements. In one implementation, the method 700 provides the patterned lid 108 and couples the patterned lid 108 to the substrate 110 using the interconnecting elements 112.

In a block 704, the method 700 disposes interposers on a substrate using solder balls. In one implementation, the method 700 disposes the interposers 126 and 128 on the substrate 110 using solder balls 130.

In a block 706, the method 700 disposes auxiliary modules on the interposers. In one implementation, the method 700 disposes the auxiliary modules 118 and 120 on the interposers 128 and 126, respectively.

In a block 708, the method 700 thermally couples the auxiliary modules to the lid using a thermal interface material (TIM). In one implementation, the method 700 couples the auxiliary modules 118 and 120 to the patterned lid 108 using the thermal interface material (TIM) 122.

In a block 710, the method 700 tests the assembly without a processor module. In one implementation, the method 700 tests the integrated circuit (IC) assembly 100 without the processor module 116 installed.

In a block 712, the method 700 determines whether the integrated circuit (IC) assembly 100 without the processor module passes the test(s). In one implementation, the method 700 tests the integrated circuit (IC) assembly 100 without the processor module 116.

If the integrated circuit (IC) assembly 100 without the processor module passes the test(s), then in a block 714 the method 700 verifies that the auxiliary modules 118 and 120 are known good modules (KGDs).

In a block 716, the method 700 disposes a processor module on the substrate using solder balls. In one implementation, the method 700 disposes the processor module 116 on the substrate 110 using solder balls 130.

In a block 718, the method 700 thermally couples the processor module to the lid using a thermal interface material (TIM).

If, on the other hand, the integrated circuit (IC) assembly 100 without the processor module does not pass the test(s), then in a block 720 the method 700 discards the integrated circuit (IC) assembly 100 that has the auxiliary modules 118 and 120 installed but not the processor module 116 installed.

Integrated Circuit (IC) Assembly 200 Fabrication Method

Figure 8A:
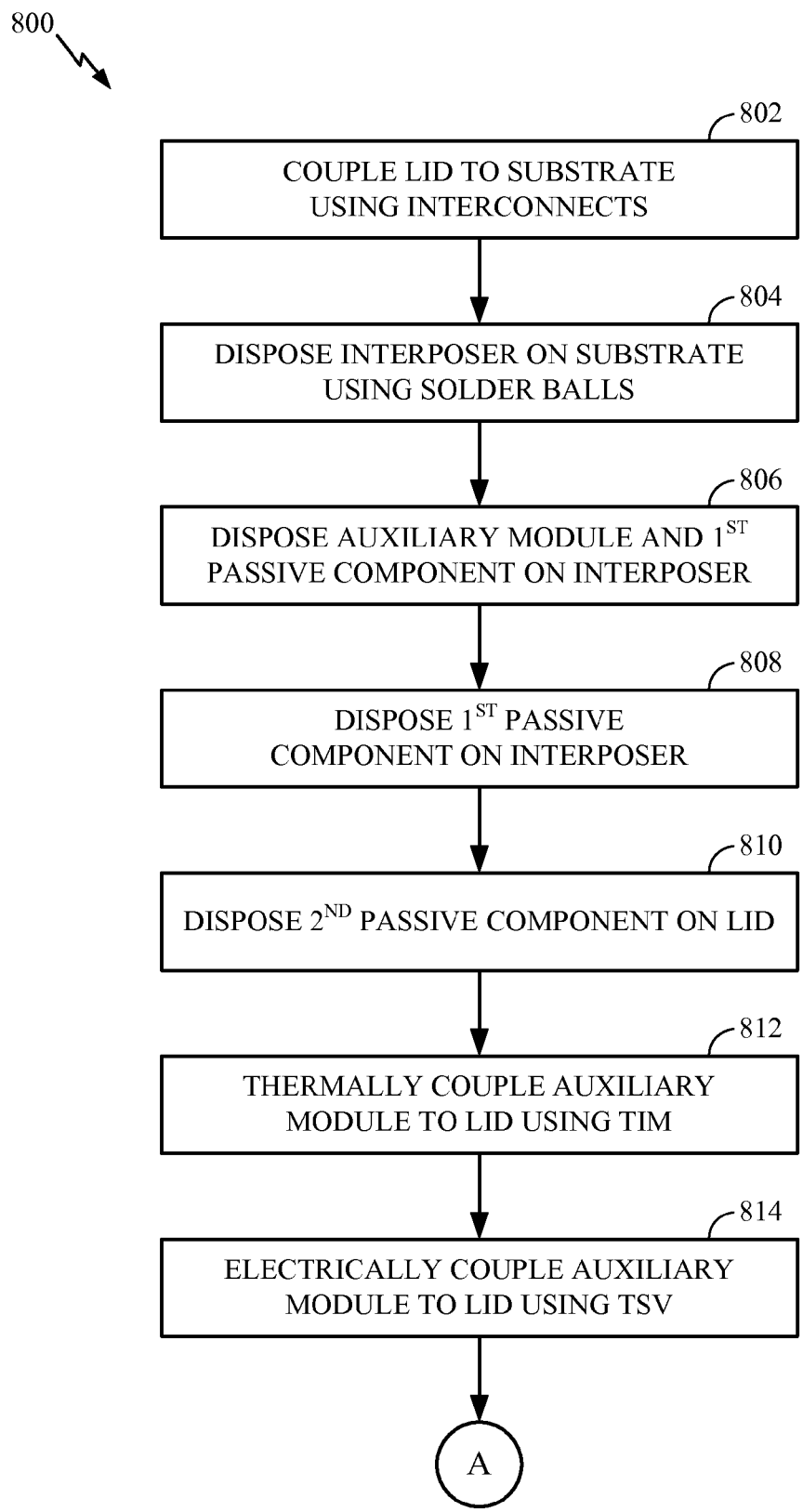
FIGS. 8A and 8B are flowcharts illustrating a method of making an integrated circuit package according to an alternative implementation of the technology described herein.
Figure 8B:
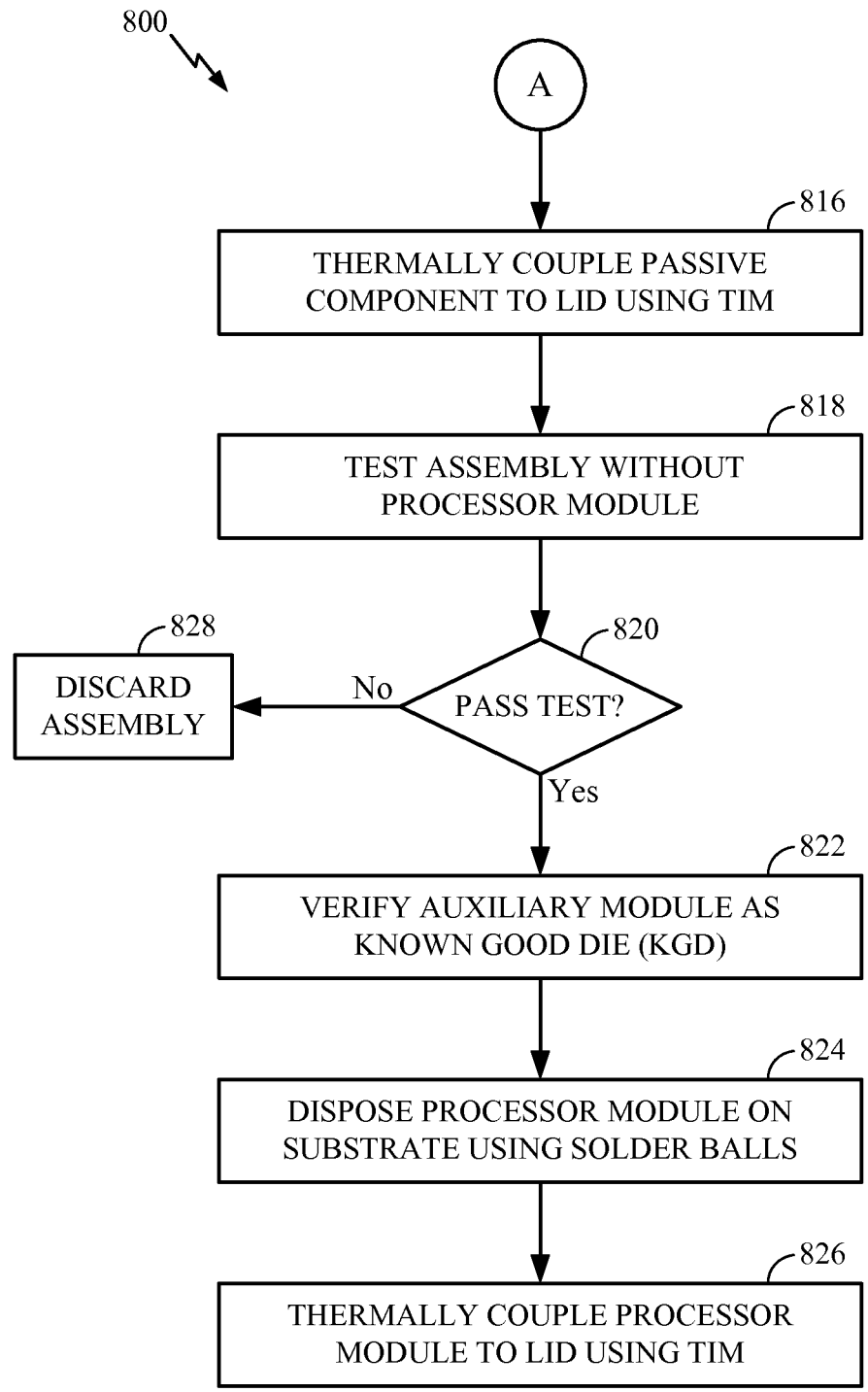

Recall from the description above that the integrated circuit (IC) assembly 200 includes a processor module, a single auxiliary module, two passive components, and a single interposer. FIGS. 8A and 8B are flowcharts illustrating a method of making the integrated circuit (IC) assembly 200 according to an implementation of the technology described herein.

In a block 802, the method 800 couples a lid to a substrate using interconnecting elements. In one implementation, the method 800 provides the patterned lid 208 and couples the patterned lid 208 to the substrate 110 using the interconnecting elements 212.

In a block 804, the method 800 disposes an interposer on a substrate using solder balls. In one implementation, the method 800 disposes the interposers 226 and 228 on the substrate 210 using solder balls 230.

In a block 806, the method 800 disposes an auxiliary module on the interposer. In one implementation, the method 800 disposes the auxiliary module 218 on the interposer 226.

In a block 808, the method 800 disposes a first associated passive component on the interposer. In one implementation, the method 800 disposes the passive component 234 on the interposer 226.

In a block 810, the method 800 disposes a second passive component on the lid. In one implementation, the method 800 disposes the passive component 236 on the patterned lid 208.

In a block 812, the method 800 thermally couples the auxiliary module to the lid using a thermal interface material (TIM). In one implementation, the method 800 couples the auxiliary module 218 to the patterned lid 208 using the thermal interface material (TIM) 222.

In a block 814, the method 800 electrically couples the auxiliary module to the lid using at least one through-substrate via (TSV). In one implementation, the method 800 electrically couples the auxiliary module 218 to the patterned lid 208 using the through-substrate vias (TSVs) 238.

In a block 816, the method 800 thermally couples the second passive component to the lid using at least one through-substrate via (TSV). In one implementation, the method 800 thermally couples the passive component 236 to the patterned lid 208 using the thermal interface material (TIM) 222.

In a block 818, the method 800 tests the assembly without a processor module. In one implementation, the method 800 tests the integrated circuit (IC) assembly 200 without the processor module 216 installed.

In a block 820, the method 800 determines whether the integrated circuit (IC) assembly 200 without the processor module passes the test(s). In one implementation, the method 800 tests the integrated circuit (IC) assembly 200 without the processor module 216.

If the integrated circuit (IC) assembly 200 without the processor module passes the test(s), then in a block 822 the method 800 verifies that the auxiliary module 218 and the auxiliary module 220 are known good modules (KGDs).

In a block 824, the method 800 disposes a processor module on the substrate using solder balls. In one implementation, the method 800 disposes the processor module 216 on the substrate 210 using solder balls 230.

In a block 826, the method 800 thermally couples the processor module to the lid using a thermal interface material (TIM).). In one implementation, the method 800 couples the processor module 216 to the patterned lid 208 using the thermal interface material (TIM) 222.

If, on the other hand, the integrated circuit (IC) assembly 200 without the processor module does not pass the test(s), then in a block 828 the method 800 discards the integrated circuit (IC) assembly 200 that has the auxiliary module 218 and passive components 234 and 236 installed, but not the processor module 216 installed.

Integrated Circuit (IC) Assembly 300 Fabrication Method

Figure 9:
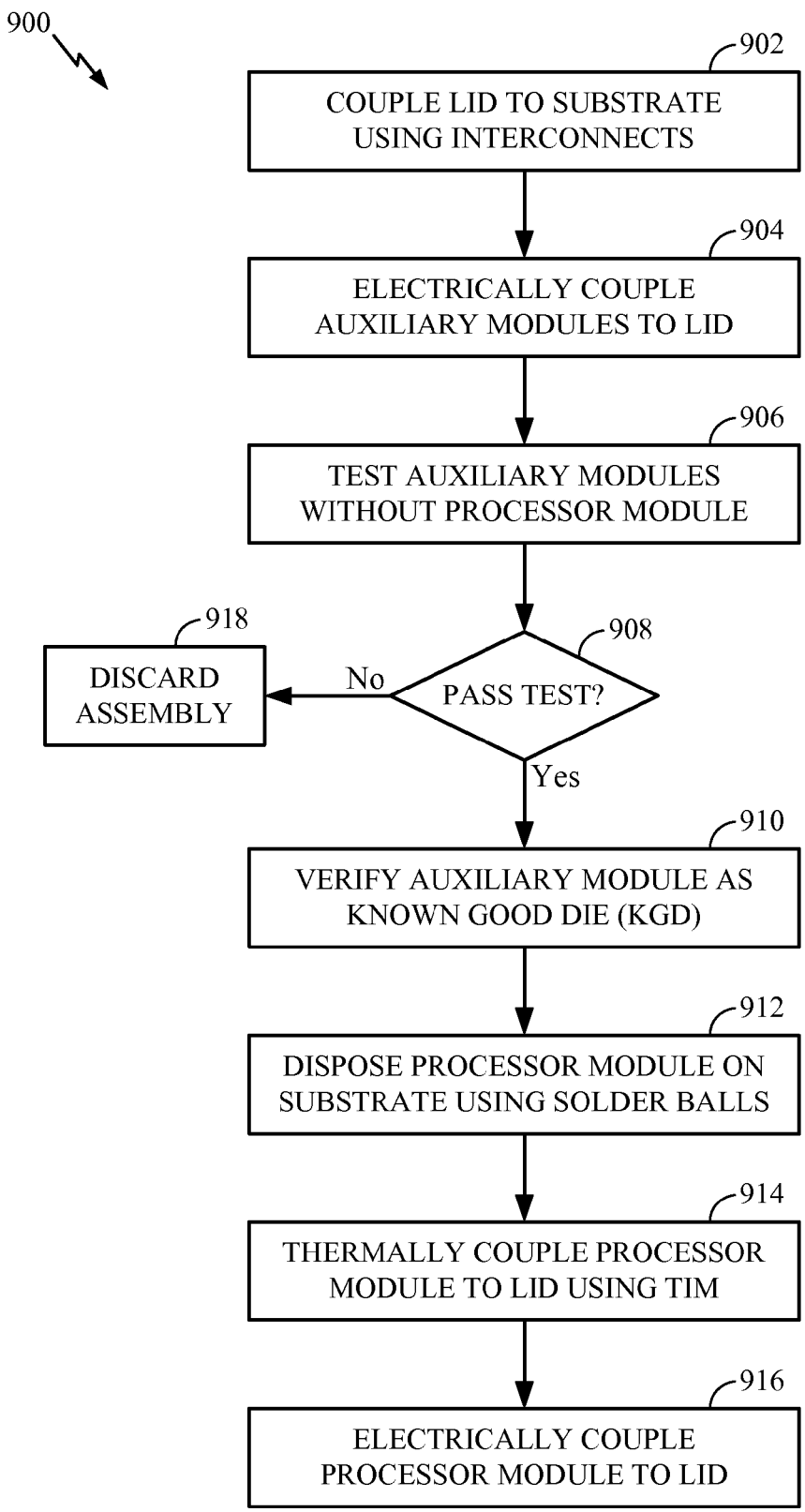
FIG. 9 is a flowchart illustrating a method of making an integrated circuit package according to still another implementation of the technology described herein.

Recall from the description above that the integrated circuit (IC) assembly 100 includes a processor module, two auxiliary modules, no passive components, and no interposers. FIG. 9 is a flowchart illustrating a method of making the integrated circuit (IC) assembly 300 according to an implementation of the technology described herein.

In a block 902, the method 900 couples a lid to a substrate using interconnecting elements. In one implementation, the method 900 provides the patterned lid 308 and couples the patterned lid 308 to the substrate 310 using the interconnecting elements 312.

In a block 904, the method 900 electrically couples auxiliary modules to the lid. In one implementation, the method 900 couples the auxiliary module 318 and auxiliary module 320 to the patterned lid 308 using the using circuitry and/or wiring 324.

In a block 906, the method 900 tests the assembly without a processor module. In one implementation, the method 900 tests the integrated circuit (IC) assembly 300 without the processor module 316 installed.

In a block 908, the method 900 determines whether the assembly without the processor module passes the test(s). In one implementation, the method 900 tests the integrated circuit (IC) assembly 300 without the processor module 116.

If the integrated circuit (IC) assembly 300 without the processor module passes the test(s), then in a block 910 the method 900 verifies that the auxiliary module 318 and the auxiliary module 320 are known good modules (KGDs).

In a block 912, the method 900 disposes a processor module on the substrate using solder balls. In one implementation, the method 900 disposes the processor module 316 on the substrate 310 using solder balls 330.

In a block 914, the method 900 thermally couples the processor module to the lid using a thermal interface material (TIM). In an implementation, the method 900 thermally couples the processor module 316 to the lid using a thermal interface material (TIM) 322.

In a block 916, the method 900 electrically couples the processor module to the lid using a thermal interface material (TIM). In one implementation, the method 900 electrically couples the processor module 316 to the lid using a thermal interface material (TIM) 322.

If, on the other hand, the integrated circuit (IC) assembly 300 without the processor module does not pass the test(s), then in a block 918 the method 900 discards the integrated circuit (IC) assembly 100 that has the auxiliary modules 118 and 120 installed but not the processor module 116 installed.

Interconnecting Elements

As described above, in one or more implementations a patterned lid and a package substrate may be coupled to each other through a substrate using solder ball, through a patterned stiffener using anisotropic conductive adhesive, or through a socket.

Figure 10:
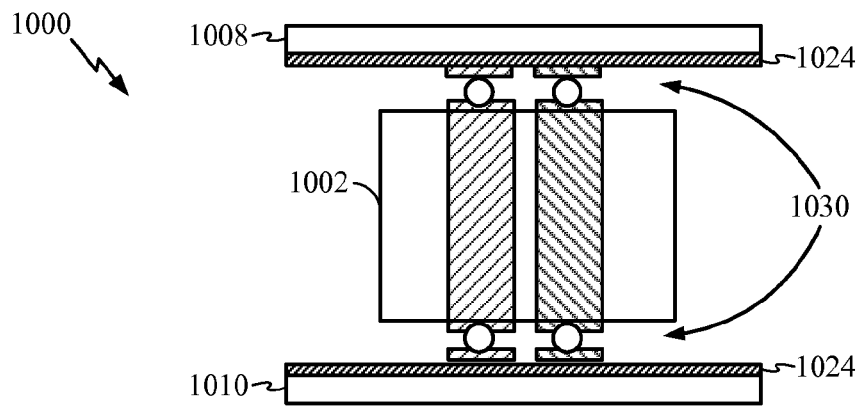
FIG. 10 is a cross-section view of an interconnecting element according to one or more implementations of the technology described herein.

FIG. 10 is a cross-section view of an interconnecting element 1000 according to one or more implementations of the technology described herein in which the patterned lid and a package substrate are coupled to each other through a substrate using solder ball. In the illustrated implementation, a patterned lid 1008 and a package substrate 1010 are be coupled to each other through a substrate 1002 using solder balls 1030. Circuitry and/or wiring 1024 are disposed in and/or on the patterned lid 1008 and the package substrate 1010.

Figure 11:
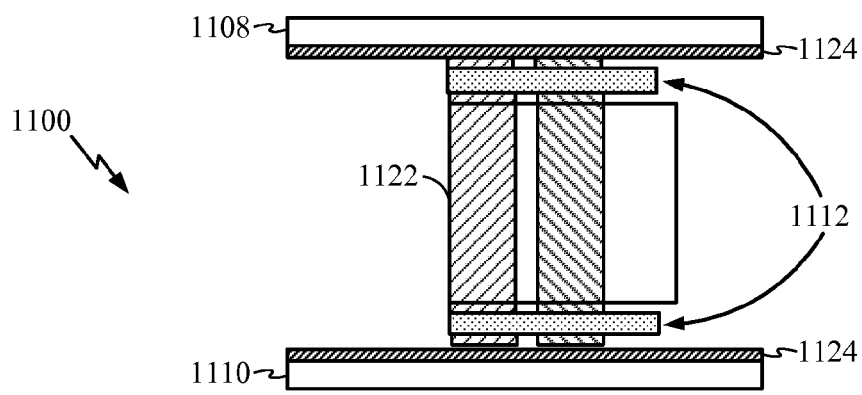
FIG. 11 is a cross-section view of an interconnecting element according to one or more alternative implementations of the technology described herein.

FIG. 11 is a cross-section view of an interconnecting element 1100 according to one or more alternative implementations of the technology described herein in which a patterned lid and a package substrate are coupled to each other through patterned stiffeners 1112 using thermal interface material (TIM) 1122 (i.e., anisotropic conductive adhesive. Circuitry and/or wiring 1124 are disposed in and/or on the patterned lid 1108 and the substrate 1110.

Figure 12:
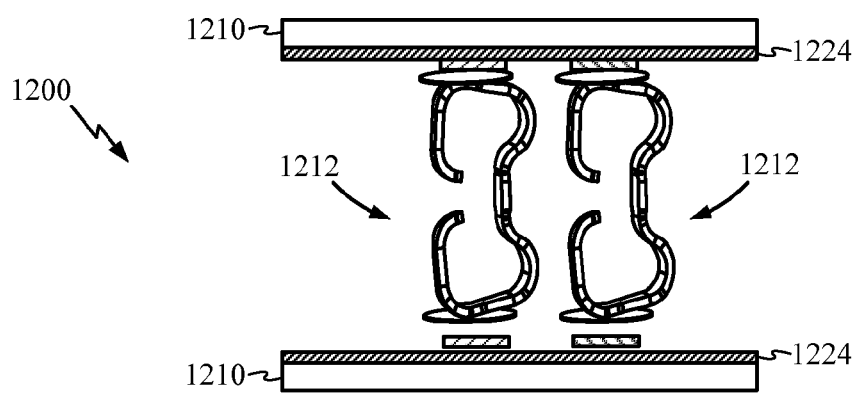
FIG. 12 is a cross-section view of an interconnecting element according to still other implementations of the technology described herein.

FIG. 12 is a cross-section view of an interconnecting element according to still other implementations of the technology described herein in which a patterned lid and a package substrate are coupled to each other through a socket. In the illustrated implementation, a patterned lid 1208 and a package substrate 1210 are be coupled to each other through a substrate 1202 using sockets 1212. Circuitry and/or wiring 1224 are disposed in and/or on the patterned lid 1208 and the package substrate 1210.

Although steps and decisions of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the order described above. Furthermore, not every illustrated step and decision may be required in every embodiment/variant in accordance with the invention, while some steps and decisions that have not been specifically illustrated may be desirable or necessary in some embodiments/variants in accordance with the invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:
1. An apparatus, comprising:
a substrate;
an interposer coupled to the substrate;
a processor;
an auxiliary circuit coupled to the interposer, wherein the auxiliary circuit is at least one of a memory or a power management integrated circuit (PMIC);
a first passive component disposed on the interposer and coupled to the auxiliary circuit;
a patterned lid, wherein the patterned lid comprises a multilayer substrate having dielectric material and wherein the processor and the auxiliary circuit are electrically and mechanically coupled to the patterned lid; and
a second passive component disposed on the patterned lid and configured to electrically couple to the auxiliary circuit.
2. The apparatus of claim 1, further comprising thermal interface material (TIM) disposed on the patterned lid and on at least one of the processor or the auxiliary circuit to thermally couple the at least one of the processor or the auxiliary circuit to the patterned lid.

3. The apparatus of claim 1, further comprising a printed circuit board (PCB) coupled to the substrate.

4. The apparatus of claim 1, further comprising at least two interconnecting elements coupled between the patterned lid and the substrate.

5. The apparatus of claim 1, wherein the first passive component is coupled to the auxiliary circuit using at least one through-substrate via (TSV).

6. The apparatus of claim 1, further comprising at least one decoupling capacitor coupled to the patterned lid.

7. The apparatus of claim 1, wherein the multilayer substrate of the patterned lid comprises a copper plate, and wherein the dielectric material is patterned with at least one of vias or interconnects to electrically couple at least one of the processor, the auxiliary circuit, or the first passive component to the patterned lid.

8. The apparatus of claim 7, wherein the dielectric material is patterned with the at least one of vias or interconnects to electrically coupled at least two of the processor, the auxiliary circuit, or the first passive component together.

9. A method of manufacturing an integrated circuit (IC) package, the method comprising:
providing a substrate;
providing an interposer coupled to the substrate;
providing a processor;
providing an auxiliary circuit coupled to the interposer, wherein the auxiliary circuit is at least one of a memory or a power management integrated circuit (PMIC);
disposing a first passive component on the interposer;
coupling the first passive component to the auxiliary circuit;
providing a patterned lid, the patterned lid comprising a multilayer substrate having dielectric material;
electrically and mechanically coupling the processor and the auxiliary circuit to the patterned lid;
providing a second passive component disposed on the patterned lid; and
electrically coupling the second passive component to the auxiliary circuit.

10. The method of claim 9, further comprising disposing thermal interface material (TIM) on the patterned lid and on at least one of the processor or the auxiliary circuit to thermally couple the at least one of the processor or the auxiliary circuit to the patterned lid.

11. The method of claim 9, further comprising:
providing a printed circuit board (PCB); and
coupling the printed circuit board (PCB) to the substrate.

12. The method of claim 9, coupling at least two interconnecting elements between the patterned lid and the substrate.

13. The method of claim 9, further comprising coupling the first passive component to the auxiliary circuit using at least one through-substrate via (TSV).

14. The method of claim 9, further comprising:
providing at least one decoupling capacitor; and
coupling the at least one decoupling capacitor to the patterned lid.

15. A computer-readable storage medium including data that, when accessed by a machine, cause the machine to perform operations comprising:
providing a substrate;
providing an interposer coupled to the substrate;
providing a processor;
providing an auxiliary circuit coupled to the interposer, wherein the auxiliary circuit is at least one of a memory or a power management integrated circuit (PMIC);
disposing a first passive component on the interposer;
coupling the first passive component to the auxiliary circuit;
providing a patterned lid, the patterned lid comprising a multilayer substrate having dielectric material;
electrically and mechanically coupling the processor and the auxiliary circuit to the patterned lid;
providing a second passive component disposed on the patterned lid; and
electrically coupling the second passive component to the auxiliary circuit.

16. The computer-readable storage medium of claim 15, further comprising data that, when accessed by the machine, cause the machine to perform operations comprising disposing thermal interface material (TIM) on the patterned lid and on at least one of the processor or the auxiliary circuit to thermally couple the at least one of the processor or the auxiliary circuit to the patterned lid.

17. The computer-readable storage medium of claim 15, further comprising data that, when accessed by the machine, cause the machine to perform operations comprising:
providing a printed circuit board (PCB); and
coupling the printed circuit board (PCB) to the substrate.

18. The computer-readable storage medium of claim 15 further comprising data that, when accessed by the machine, cause the machine to perform operations comprising coupling at least two interconnecting elements between the patterned lid and the substrate.

19. The computer-readable storage medium of claim 15, further comprising data that, when accessed by the machine, cause the machine to perform operations comprising coupling the first passive component to the auxiliary circuit using at least one through-substrate via (TSV).

20. The computer-readable storage medium of claim 15, further comprising data that, when accessed by the machine, cause the machine to perform operations comprising:
providing at least one decoupling capacitor; and
coupling the at least one decoupling capacitor to the patterned lid.

21. An apparatus, comprising:
a substrate;
an interposer coupled to the substrate;
a processor;
an auxiliary circuit coupled to the interposer, wherein the auxiliary circuit is at least one of a memory or a power management integrated circuit (PMIC);
a first passive component disposed on the interposer and coupled to the auxiliary circuit;
a patterned lid, the patterned lid comprising a multilayer substrate having dielectric material;
means for electrically and mechanically coupling the processor and the auxiliary circuit to the patterned lid; and
a second passive component disposed on the patterned lid and configured to electrically couple to the auxiliary circuit.

22. The apparatus of claim 21, wherein the means for electrically and mechanically coupling the processor and the auxiliary circuit to the patterned lid includes means for thermally coupling the processor and the auxiliary circuit to the patterned lid.

23. The apparatus of claim 22, wherein the means for thermally coupling the processor and the auxiliary circuit to the patterned lid includes a thermally conductive adhesive.

24. The apparatus of claim 21, wherein the means for electrically and mechanically coupling the processor and the auxiliary circuit to the patterned lid includes solder.

25. The apparatus of claim 21, wherein the means for coupling the processor and the auxiliary circuit to the patterned lid includes means for mechanically coupling the processor and the auxiliary circuit to the patterned lid.

* * * * *